(12) United States Patent
Venezia et al.

(10) Patent No.: US 8,274,101 B2
(45) Date of Patent: Sep. 25, 2012

(54) CMOS IMAGE SENSOR WITH HEAT MANAGEMENT STRUCTURES

(75) Inventors: Vincent Venezia, Los Gatos, CA (US);
Duli Mao, Sunnyvale, CA (US);
Hsin-Chih Tai, San Jose, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 178 days.

(21) Appl. No.: 12/852,990

(22) Filed: Aug. 9, 2010

(65) Prior Publication Data
US 2011/0089517 A1    Apr. 21, 2011

Related U.S. Application Data

(60) Provisional application No. 61/253,401, filed on Oct. 20, 2009.

(51) Int. Cl.
*H01L 27/148* (2006.01)
(52) U.S. Cl. .................. 257/228; 257/225; 257/E27.13
(58) Field of Classification Search .......... 136/200–242; 257/294, 435, 225, 228, 226, E27.13
See application file for complete search history.

(56) References Cited

U.S. PATENT DOCUMENTS

| 7,061,111 | B2 * | 6/2006 | McTeer ......................... 257/751 |
| 2004/0000333 | A1 * | 1/2004 | Chen et al. ..................... 136/224 |
| 2006/0076590 | A1 * | 4/2006 | Pain et al. ..................... 257/294 |
| 2010/0176506 | A1 * | 7/2010 | Hsu et al. ...................... 257/698 |

* cited by examiner

*Primary Examiner* — Matthew Reames
(74) *Attorney, Agent, or Firm* — Blakely Sokoloff Taylor & Zafman LLP (57) ABSTRACT

An image sensor includes a device wafer substrate of a device wafer, a device layer of the device wafer, and optionally a heat control structure and/or a heat sink. The device layer is disposed on a frontside of the device wafer substrate and includes a plurality of photosensitive elements disposed within a pixel array region and peripheral circuitry disposed within a peripheral circuits region. The photosensitive elements are sensitive to light incident on a backside of the device wafer substrate. The heat control structure is disposed within the device wafer substrate and thermally isolates the pixel array region from the peripheral circuits region to reduce heat transfer between the peripheral circuits region and the pixel array region. The heat sink conducts heat away from the device layer.

19 Claims, 7 Drawing Sheets

BSI Image Sensor with structure for cooling peripheral circuits

FIG. 1
(PRIOR ART)

FIG. 2: BSI Image Sensor with heat sink structure

FIG. 3: Fabrication Flow Chart

FIG. 4: BSI Image Sensor with structure for cooling peripheral circuits

FIG. 5: BSI Image Sensor with structure for thermally isolating image array

FIG.6. BSI Image Sensor with structure for thermally isolating pixel array region

FIG. 7

CMOS IMAGE SENSOR WITH HEAT MANAGEMENT STRUCTURES

CROSS-REFERENCE TO RELATED APPLICATIONS

This application claims the benefit of U.S. Provisional Application No. 61/253,401 filed on Oct. 20, 2009, the contents of which are incorporated herein by reference.

TECHNICAL FIELD

This disclosure relates generally to image sensors, and in particular but not exclusively, relates to CMOS image sensors.

BACKGROUND INFORMATION

Integrated circuit technology has revolutionized various fields, including computers, control systems, telecommunications and imaging. In the field of imaging, the charge coupled device (CCD) image sensor has made digital imaging possible. An alternative low cost technology to CCD image sensors is the CMOS active pixel image sensor. Not only are imaging devices using CMOS image sensor technology less expensive to manufacture relative to the CCD imaging device, but the signal processing circuitry can be fabricated alongside the imaging circuitry, thus allowing for a single integrated chip to form a complete stand alone imaging device.

Because of their lower cost, CMOS imaging devices are now used in many applications. Some of these applications are in high temperature environments, such as automotive applications. However, elevated temperatures at the photodiode sites can cause the CMOS image sensor to experience degradation in performance. Specifically, unwanted "dark current" increases exponentially with the operating temperature of the image sensor. The dark current contributes to the noise and limits the amplification that can be applied to the output signal of each pixel of the image sensor. This results in a diminished signal-to-noise ratio (SNR) and poorer image quality than may be realized at lower operating temperatures. Elevated temperatures at the photodiode sites may result when the photodiodes are proximal to high speed peripheral circuits that may generate heat during operation.

Backside illuminated (BSI) CMOS image sensors (CIS) are formed by bonding image sensor device wafers to carrier wafers followed by thinning down the silicon substrate of the device wafers. With less silicon substrate remaining, heat generated by the peripheral circuitry is not dissipated as readily and may propagate into the imaging array region and degrade image quality.

One technique for managing heat buildup in a CMOS image sensor is to secure an active electronic cooling device to the CMOS image sensor, which is integrated into the chip package. The active electronic cooling device may be a Peltier, Seebeck, Thompson or other physical effect device that causes heat to be transported by the flow of electric current. A Peltier device will transport heat from one side of the device, known as the cold side, to the other side of the device, known as the hot side, when current flows through the Peltier device. Thus, by placing the cold side of the Peltier device proximal to the CMOS image sensor, the CMOS image sensor may be cooled.

This arrangement may work well with a front side illuminated CMOS image sensor in which the backside of the device is free to be placed proximal to the Peltier device. However, for backside illuminated devices the backside must remain unobstructed with respect to the light coming from the image. The frontside of these devices will have circuit related metal interconnect lines and insulating layers that may significantly restrict heat flow from the image sensor substrate out to a heat sinking device.

Figure 1:
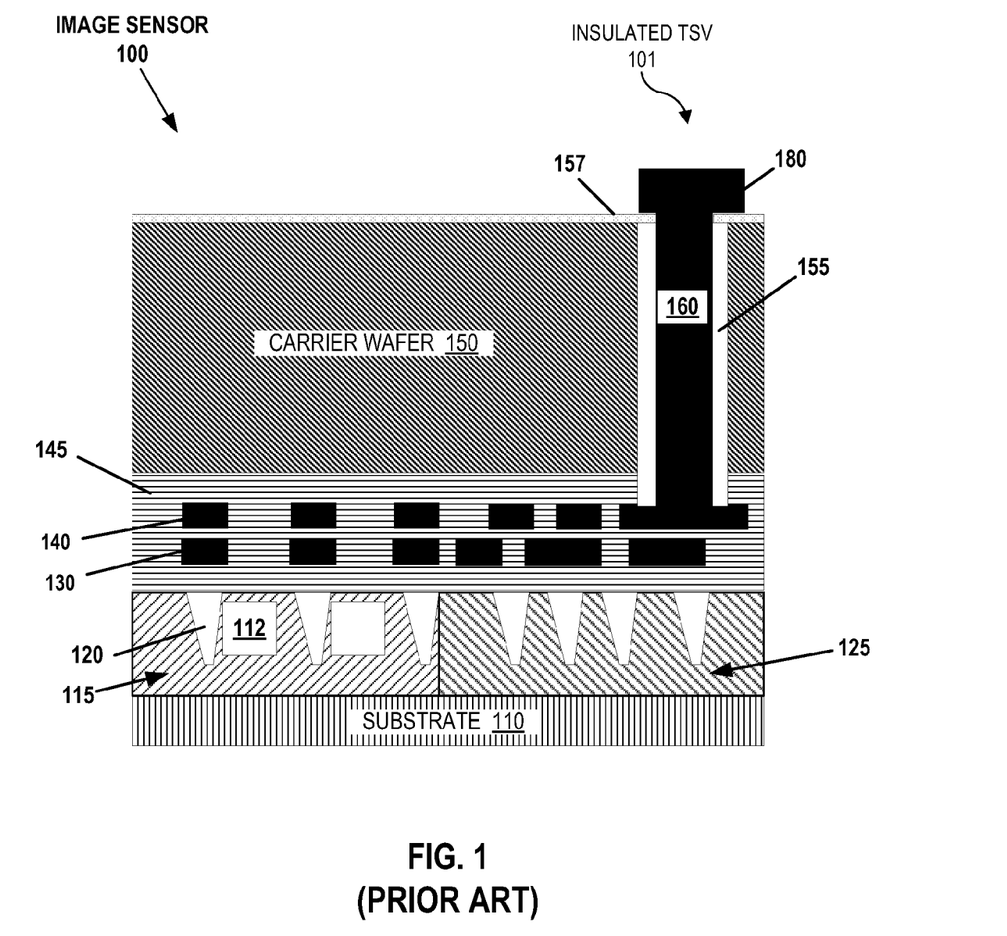
FIG. 1 (PRIOR ART) is a cross sectional diagram of a conventional backside illuminated CMOS image sensor.

BSI CIS are formed by bonding the frontside (circuit side) of image sensor device wafers to carrier wafers followed by thinning the backside of the device wafers. For small pixel size image sensors, the final device wafer thickness is very thin, perhaps only several microns. This is shown in FIG. 1 which shows a cross section of image sensor 100. Device wafer substrate 110, upon which photodiode array elements 112 have been fabricated within pixel array region 115 and periphery circuits have been fabricated within periphery circuit region 125, has been thinned. Shallow trench isolation (STI) regions 120 isolate pixels from each other, as well as, isolate electrical components within the peripheral circuitry. Carrier wafer 150 was previously bonded to the frontside of the device wafer in order to support it during the thinning process. The device wafer is insulated from carrier wafer 150 by the frontside backend of line (BEOL) film stack which includes first metal interconnect layer 130, second metal interconnect layer 140, and inter-metal dielectrics and passivation films 145. FIG. 1 also illustrates an insulated through-silicon-via (TSV) 101 extending through carrier wafer 150. Insulated TSV 101 includes metal post 160, insulating layers 155 and 157, and top metal lead 180. Insulated TSV 101 is used to electrically connect the metal interconnects of the device wafer circuit elements to the region above the carrier wafer where redistribution top metal leads 180 are formed. The TSV post is electrically insulated from carrier wafer 150. Inter-metal dielectric and passivation films 145 and insulating regions 155 are relatively poor thermal conductors compared to silicon. Heat generated during device operation on the Si device wafer cannot be effectively dissipated to carrier wafer 150, resulting in excessive heat buildup in the device wafer. This leads to higher operating temperature and poorer performance of the BSI image sensor (e.g. higher dark current and white pixels).

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of operation for an image sensor with heat management (or heat control) structures are described herein. In particular, improved structures for both conducting heat away from backside illuminated (BSI) CMOS image sensors and limiting the impact on the imaging array of heat generated by the peripheral circuitry are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

Figure 2:
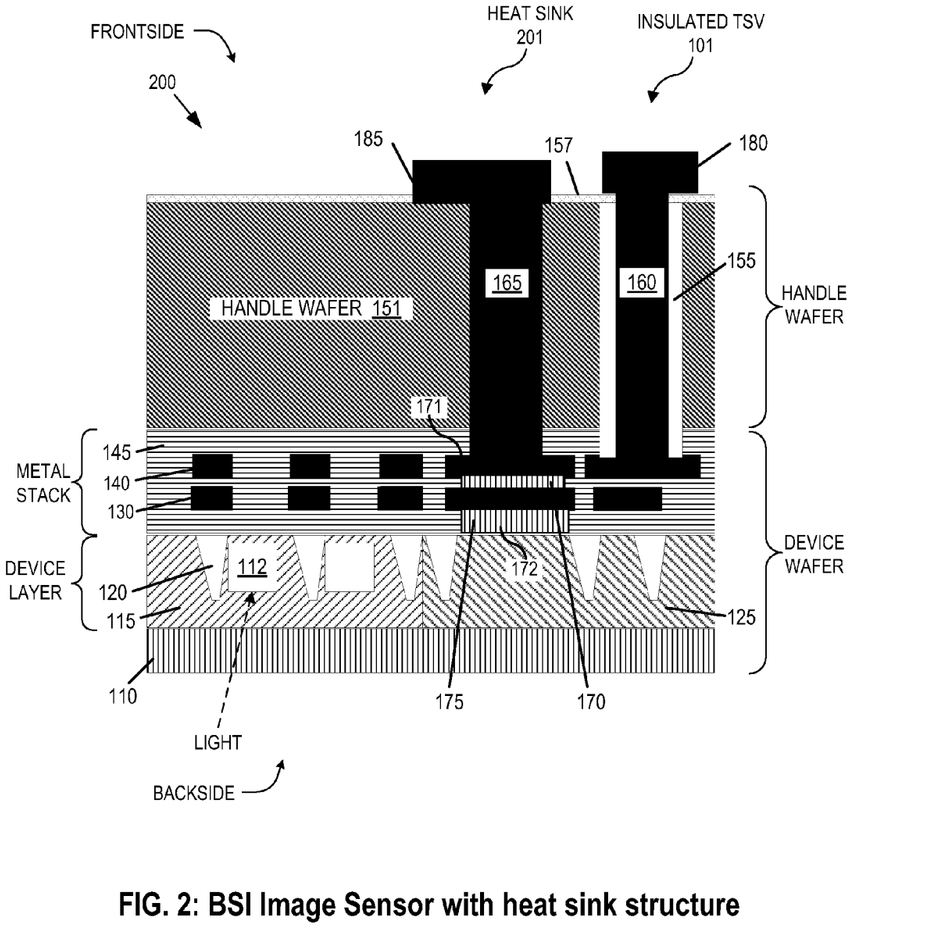
FIG. 2 is a cross sectional diagram of a backside illuminated CMOS image sensor, according to a first embodiment of this disclosure.

FIG. 2 is a cross sectional view illustrating an BSI CMOS image sensor 200 with an integrated metal heat sink, in accordance with an embodiment of the invention. The heat sink 201 includes large area metal pads at both first metal interconnect layer 130 and second metal interconnect layer 140, which are connected vertically through contacts 175 and vias 170. Contacts 175 and vias 170 can be either an array of small contacts and vias (e.g., laterally adjacent sub-vias or sub-contacts) or one large contact and via for each heat sink. Metal post 165 is also part of the structure of heat sink 201 as is metal lead 185. Metal post 165 extends through handle wafer 151 and makes direct uninsulated electrical and thermal contact to handle wafer 151. In the illustrated embodiment, there is no insulating region between post 165 and handle wafer 151. There may also be no insulating layer between metal lead 185 and handle wafer 151. As shown in FIG. 1, insulating layer 155 stands between post 160 and handle wafer 151 and insulating layer 157 lies between metal lead 180 and handle wafer 151. Heat may be conducted away from substrate 110 and the device layer (i.e., the epitaxial layer in which pixel array region 115 and peripheral circuits region 125 are disposed) through the BEOL layers (e.g., metal interconnection layers 130 and 140 and inter-metal dielectric layers 145; these layers are often referred to as the "metal stack") by the components of heat sink 201, which include metal pads 171 and 172, contact(s) 175, via(s) 170, metal post 165, and metal lead 185. It should be appreciated that FIG. 2 only illustrates a portion of image sensor 200, and as such, some embodiments of image sensor 200 may include a plurality of heat sinks 201.

Figure 3:
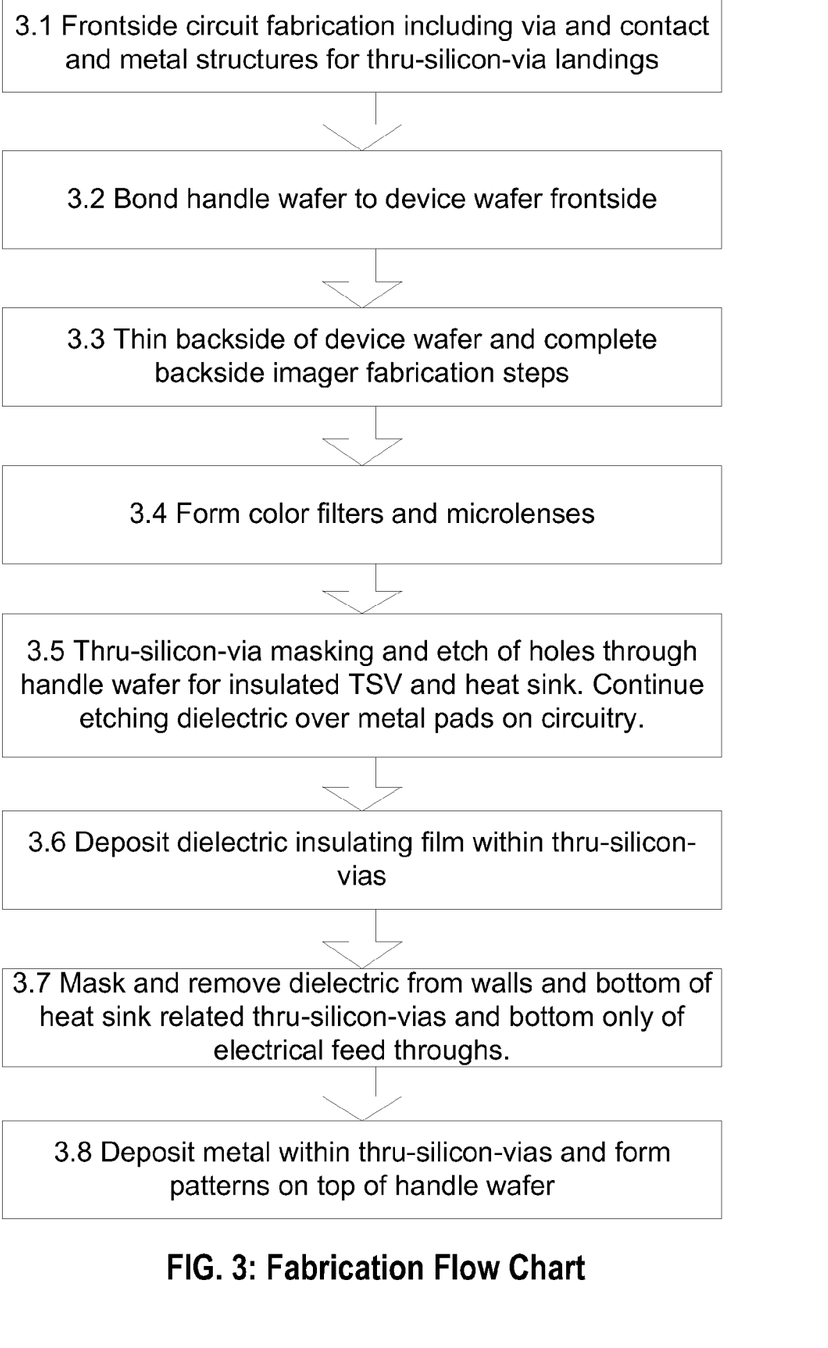
FIG. 3 is a flow chart illustrating a process for fabricating a backside illuminated CMOS image sensor, according to an embodiment of this disclosure.

FIG. 3 is a flow chart illustrating a process 300 to fabricate BSI CMOS image sensor 200 with integrated heat sinks 201, in accordance with an embodiment. A standard backside-illuminated CMOS image sensor fabrication process sequence is followed by typical through-silicon-via (TSV) process. The process differs from a typical TSV process in the photo patterning of the TSV dielectric layer etch. Instead of etching only the bottom of the via openings to expose the underlying metal pads, the dielectric around heat sink 201 is also etched to expose handle wafer 151 silicon so that the conductive structures of heat sink 201 make direct, un-insulated thermal and electrical contact to the silicon of handle wafer 151 thereby improving heat conduction out of handle wafer 151 and the metal stack.

In a process block 3.1, frontside fabrication steps including contact, via, and metal structures to be used as TSV landings are formed. In a process block 3.2, the handle wafer 151 is bonded to the frontside of the device wafer, in which the frontside circuits have been fabricated. In one embodiment, a nitride passivation layer is disposed over the top of the metal stack and then a layer of oxide is used to chemically bond handle wafer 151 to the topside of the device wafer. In a process block 3.3, the device wafer is thinned from its backside using handle wafer 151 for support. In a process block 3.4, a color filter array and microlens array are fabricated over the light incident backside of BSI CMOS image sensor 200. In a process block 3.5, the TSVs are formed using photolithographic masking and etching of holes through handle wafer 151 and etching through the inter-metal dielectric layers 145 over metal pad 171 and the pad in metal layer 145 for insulated TSV 101. In a process block 3.6, a dielectric insulating film is deposited within the TSVs. In a process block 3.7, the dielectric insulating film is masked and removed from within the TSVs that are designated for heat sink(s) 201, while retained within insulated TSV 101 to form insulating layers 155 and 157. The dielectric insulating film is also removed from the bottom of all the TSVs to expose the metal interconnect layer(s) 140 or 130. In a process block 3.8, metal is deposited into the exposed TSVs and patterned on top of handle wafer 151 to form metal leads 180 and 185 and metal path lines on top of handle wafer 151. The TSVs designated for heat sink(s) 201 have the metal directly in contact with the material of handle wafer 151, while the TSVs designed for insulated TSV 101 do not. In some embodiments, multiple metal heat sinks 201 are placed near the peripheral digital circuits to improve heat conduction to the topside of handle wafer 151 where is can be dissipated from metal leads 185.

Figure 4:
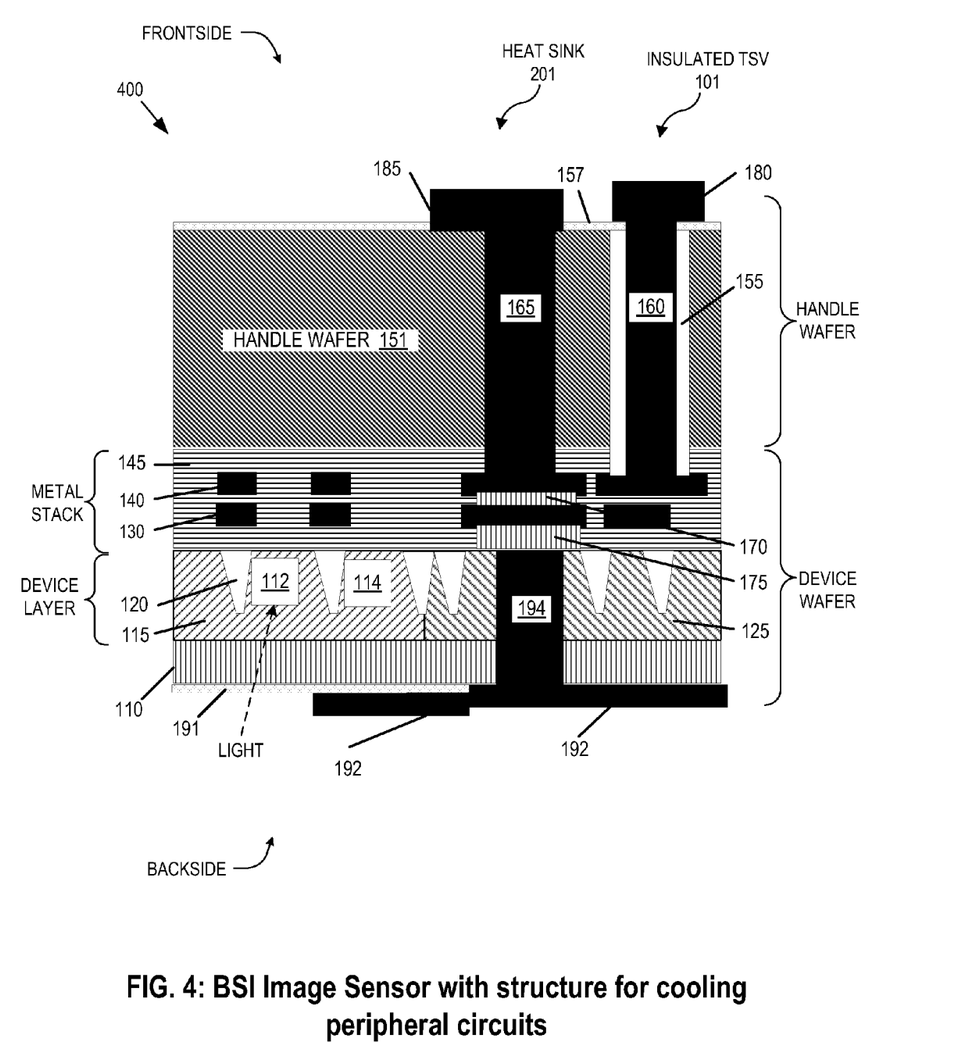
FIG. 4 is a cross sectional diagram of a backside illuminated CMOS image sensor, according to a second embodiment of this disclosure.

FIG. 4 illustrates a BSI CMOS image sensor 400 with an additional structure for managing heat flow into pixel array region 115, in accordance with an embodiment. This additional structure may be used in conjunction with or independently of heat sink 201. The illustrated embodiment of BSI CMOS image sensor 400 is similar to BSI CMOS image sensor 200 with the addition of a through silicon heat sink (TSHS) structure 194. TSHS structure 194 is formed by the partial removal of the device silicon substrate and refilling with an appropriate metal or other thermal conductor material. TSHS structure 194 extends completely through the remaining thickness of the device substrate and up to the top surface of the silicon circuitry where it may be contacted by contact 175. TSHS structure 194 may be in direct contact with the silicon substrate to increase thermal conduction. Although potentially less thermally efficient, for ease of manufacture using a typical TSV fabrication sequence, in some embodiments, a dielectric layer may be formed between TSHS structure 194 and silicon device substrate 110 and regions 125 and 115.

As shown in FIG. 4, TSHS structure 194 may also include a direct connection to a metal light shield layer 192. A first portion of metal light shield layer 192 is used to block light to a reference dark pixel element 114 within pixel array region 115. Typically, metal light shield layer 192 is separated from substrate 110 by insulating layer 191. To improve heat management effectiveness of TSHS structure 194 a portion of insulating layer 191 may be removed from substrate 110 under periphery circuits region 125 prior to formation of metal light shield layer 192. In this way a second portion of metal light shield 192 is formed directly in contact with substrate 110 under periphery circuits region 125, which improves thermal conduction to metal light shield 192 and through TSHS structure 194 preventing heat flow into pixel array region 115. Thus, TSHS structure 194 conducts heat generated in peripheral circuits region 125 up through heat sink 201 away from pixel array region 115 and operates as a thermal block that thermally isolates pixel array region 115 from peripheral circuits region 125.

A CMOS image sensor incorporating TSHS structure 194 may be fabricated by adding fabrication process steps following backside thinning in a typical BSI CMOS image sensor fabrication sequence. In one such sequence, after backside thinning and backside doping, insulating layer 191 is deposited and masked and removed from the surface of substrate 110 under periphery circuits region 125. Masking and deep silicon etching steps similar to those used in a typical TSV process are used to form openings from the backside surface of substrate 110 to the frontside surface. Metal is deposited into the formed openings. The metal deposition used to form metal light shield 192 may be used for this purpose. Fabrication steps then resume as are typical for BSI CMOS image sensors.

Figure 5:
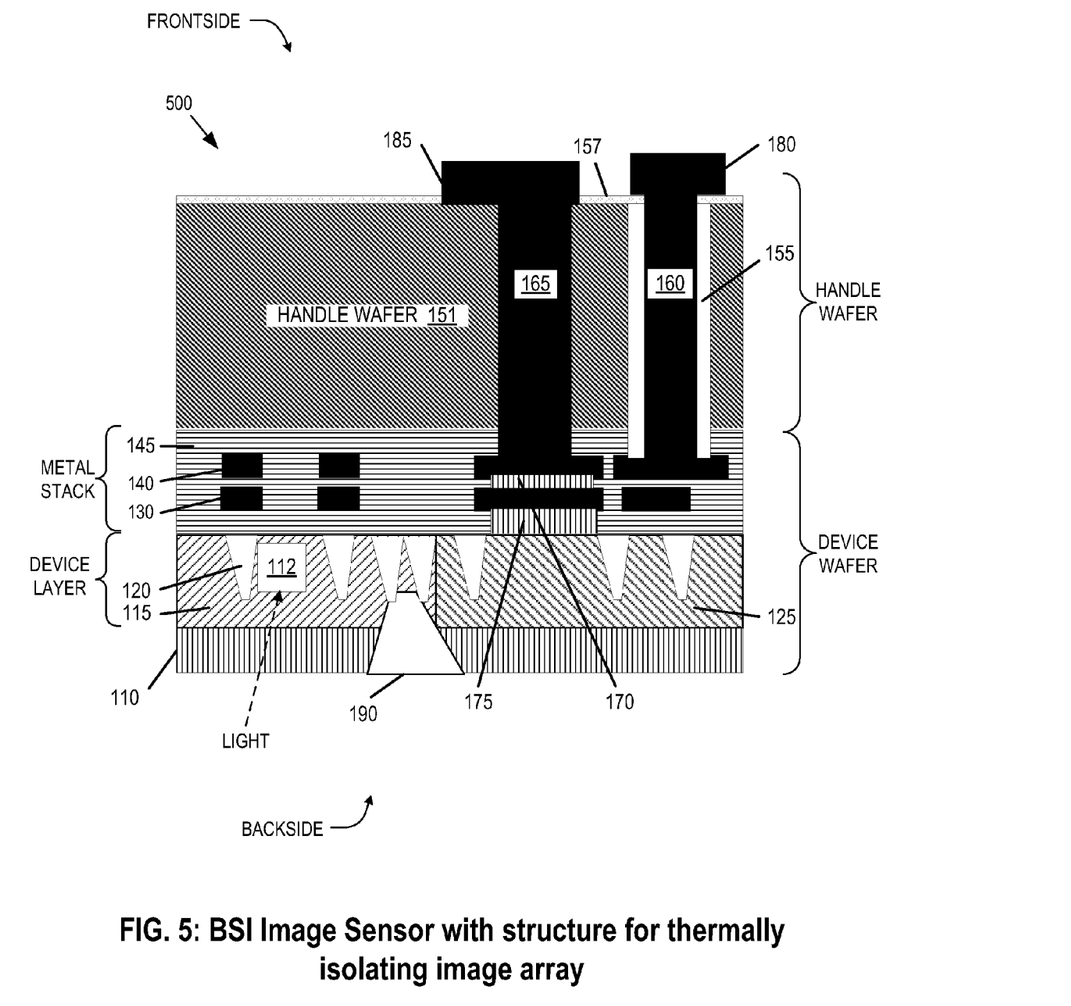
FIG. 5 is a cross sectional diagram of a backside illuminated CMOS image sensor, according to a third embodiment of this disclosure.

FIG. 5 illustrates another BSI CMOS image sensor 500 including a through silicon heat barrier (TSHB) structure 190 for managing heat flow into pixel array region 115, in accordance with an embodiment. TSHB structure 190 may be used in conjunction with, or independently of, the previously described heat control structure(s). The illustrated embodiment of BSI CMOS image sensor 500 is similar to BSI CMOS image sensor 200, except with the addition of TSHB structure 190. TSHB structure 190 is formed by the partial removal of device silicon substrate 110 and refilling with a dielectric or thermal insulator material. TSHB structure 190 extends completely through the remaining thickness of the device substrate 110 and up to at least the bottom of STI regions 120. In one embodiment, the cavity formed for TSHB structure 190 is filled with a dielectric such as silicon dioxide which has much lower thermal conductivity when compared to that of the silicon it replaces. TSHB structure 190 could be formed during the early stages of the fabrication of the CMOS circuitry with manufacturing steps similar to those used to form the shallow trench isolation (STI) regions. Alternatively or in combination with that method, portions or all of the TSHB structure could be formed by etching and filling from the backside of the device wafer after thinning the backside and before the addition of the optical components (e.g., CFA, microlenses) on the backside.

Although not separately illustrated, embodiments of TSHB structure 190 may be implemented alone, or in combination with embodiments of TSHS structure 194 and heat sink 201 to improve heat management and control within a BSI CMOS image sensor.

Figure 6:
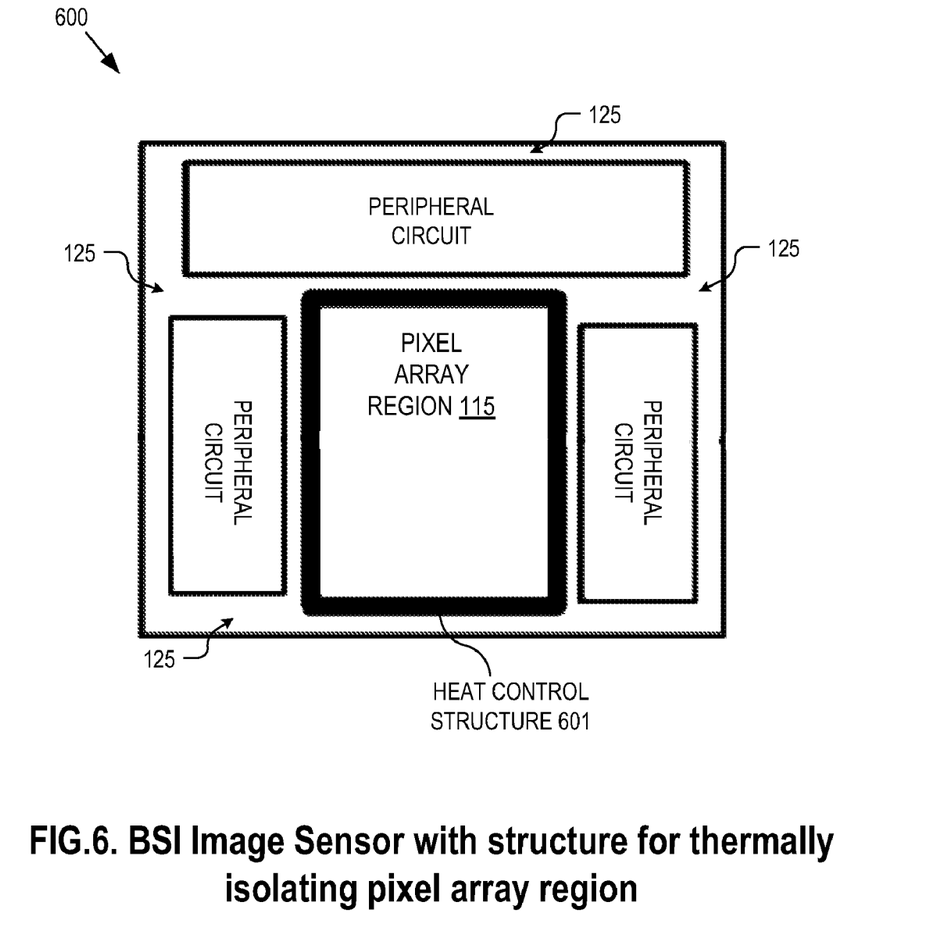
FIG. 6 is a plane view of a backside illuminated CMOS image sensor, according to an embodiment of this disclosure.

FIG. 6 is a plane view block diagram of an image sensor 600 wherein heat control structure 601 is shown as surrounding pixel array region 115 to isolate it from peripheral circuits region 125. Heat control structure 601 may be implemented using any or all of heat sink 201, TSHS structure 194, or TSHB structure 190, illustrated above in connection with FIGS. 2, 4, and 5. Pixel array region 115 includes an array of photosensitive elements (e.g., photodiodes) and in-pixel circuitry (e.g., transfer transistor, reset transistor, etc.) for each pixel. The peripheral circuits region 125 may include readout circuitry for reading out the image data from the pixel array, control circuitry for controlling operation of the pixel array, and the like. FIG. 6 illustrates just one of many possible layouts for heat control structures 601. For example, if there is heat generating circuitry only on one side of pixel array region 115, then heat control structure 601 may only be routed along that one side of pixel array region 115. If there is heat generating circuitry on two sides of pixel array region 115, then heat control structure 601 may only be routed along those two sides of pixel array region 115. In other embodiments, TSHS structure 194 and TSHB structure 190 may be formed as linearly routed "moats" while a plurality of localized heat sinks 201 may be positioned along the length of TSHS structure 194 and TSHB structure 190 to conduct heat from the device layer and backside to the front side of handle wafer 151 where external heat sinks can be coupled. Alternatively, heat sink 201 may also be a linearly run "moat" like structure instead of a plurality of localized point structures.

Figure 7:
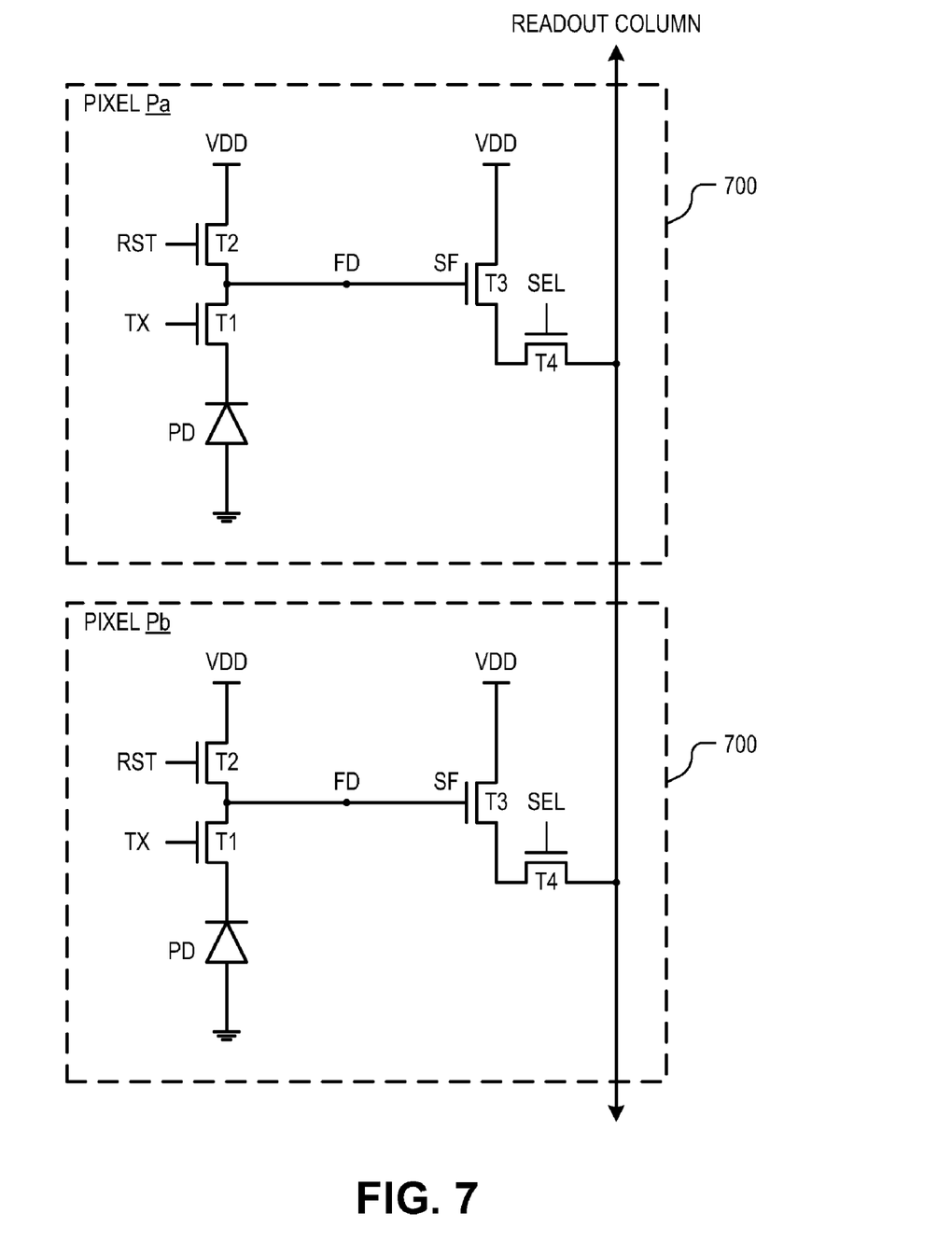
FIG. 7 is a circuit diagram illustrating pixel circuitry of two 4T pixels, in accordance with an embodiment of this disclosure.

FIG. 7 is a circuit diagram illustrating pixel circuitry 700 of two four-transistor ("4T") pixels within a pixel array, in accordance with an embodiment of the invention. Pixel circuitry 700 is one possible pixel circuitry architecture for implementing each pixel within pixel array region 115. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 7, pixels Pa and Pb are arranged in two rows and one column. The illustrated embodiment of each pixel circuitry 700 includes a photo-sensor (e.g., photodiode PD), a transfer transistor T1, a reset transistor T2, a source-follower ("SF") transistor T3 and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 700 to the readout column line under control of a select signal SEL.

The above description of illustrated embodiments of the invention is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated (BSI) image sensor, comprising:
a device wafer substrate of a device wafer;
a device layer of the device wafer disposed on a frontside of the device wafer substrate in which a plurality of photosensitive elements are disposed within a pixel array region of the device layer and in which peripheral circuitry is disposed within a peripheral circuits region of the device layer, wherein the photosensitive elements are sensitive to light incident on a backside of the device wafer substrate; and
a heat control structure disposed within the device wafer substrate and thermally isolating the pixel array region from the peripheral circuits region to reduce heat transfer between the peripheral circuits region and the pixel array region,
wherein the heat control structure extends entirely through the device wafer substrate and into the device layer.

2. The BSI image sensor of claim 1, wherein the heat control structure extends along at least one side of the pixel array region and separates the plurality of photosensitive elements from the peripheral circuitry along the at least one side.

3. The BSI image sensor of claim 2, wherein the heat control structure extends along at least two sides of the pixel array region and separates the plurality of photosensitive elements from the peripheral circuitry along the at least two sides.

4. The BSI image sensor of claim 1, wherein the heat control structure comprises a through silicon heat sink (TSHS) structure formed of a thermally conductive material, the TSHS structure extending through the device wafer substrate and the device layer.

5. The BSI image sensor of claim 4, further comprising:
a metal light shield disposed directly on the backside of the device wafer substrate and covering at least a portion of the peripheral circuits region, wherein the metal light shield is connected to the TSHS.

6. The BSI image sensor of claim 1, wherein the heat control structure comprises a through silicon heat barrier (TSHB) structure formed of a thermally insulating material.

7. The BSI image sensor of claim 6, further comprising:
a shallow trench isolation (STI) disposed within the device layer along a boundary between the pixel array region and the peripheral circuits region,
wherein the STI extends into the device layer from the frontside of the device layer,
wherein the TSHB structure extends through the device wafer substrate into the device layer and contacts the STI.

8. The BSI image sensor of claim 1, further comprising:
a metal stack including metal layers separated by an intermetal dielectric, the metal stack disposed over the frontside of the device wafer substrate above the device layer;
a second wafer bonded over the metal stack; and
a heat sink disposed through the second wafer and extending into the metal stack to conduct heat from the device layer through the metal stack and second wafer to a top surface of the second wafer,
wherein the heat sink has direct uninsulated contact with the second wafer.

9. The BSI image sensor of claim 8, wherein the heat sink further comprises:
metal vias within the metal stack interconnecting the metal layers,
wherein one of the metal vias forms a contact that extends to the device layer to conduct heat away from the device layer of the device wafer to the top surface of the second wafer.

10. The BSI image sensor of claim 9, wherein each of the metal vias comprises a plurality of laterally adjacent sub-vias.

11. The BSI image sensor of claim 8, wherein the heat sink couples to the heat control structure disposed within the device wafer substrate.

12. A complementary metal-oxide semiconductor (CMOS) image sensor, comprising:
a device wafer substrate of a device wafer;
a device layer of the device wafer disposed on a frontside of the device wafer substrate in which a plurality of photosensitive elements are disposed, wherein the photosensitive elements are sensitive to light incident on a backside of the device wafer substrate;
a metal stack including metal layers separated by an intermetal dielectric, the metal stack disposed over the frontside of the device wafer substrate with the device layer disposed between the metal stack and the device wafer substrate;
a second wafer bonded over the metal stack; and
a heat sink disposed entirely through the second wafer and extending into the metal stack of the device wafer to conduct heat from the device layer of the device wafer through the metal stack and the second wafer to a top surface of the second wafer, wherein the heat sink further includes:
metal vias within the metal stack interconnecting the metal layers,
wherein one of the metal vias forms a contact that extends to the device layer to conduct heat away from the device layer of the device wafer to the top surface of the second wafer.

13. The CMOS image sensor of claim 12, wherein the heat sink has direct uninsulated contact with the second wafer.

14. The CMOS image sensor of claim 12, wherein each of the metal vias comprises a plurality of laterally adjacent sub-vias.

15. The CMOS image sensor of claim 12, further comprising:
a heat control structure disposed within the device wafer substrate and thermally isolating a pixel array region including the plurality of photosensitive elements from a peripheral circuits region including peripheral circuitry coupled to control operation of the photosensitive elements, the heat control structure to reduce heat transfer between the peripheral circuits region and the pixel array region.

16. The CMOS image sensor of claim 15, wherein the heat control structure comprises a through silicon heat sink (TSHS) structure formed of a thermally conductive material, the TSHS structure extending through the device wafer substrate and the device layer, wherein the heat sink couples to the TSHS structure disposed within the device wafer substrate.

17. The CMOS image sensor of claim 16, further comprising:
a metal light shield disposed directly on the backside of the device wafer substrate and covering at least a portion of the peripheral circuits region, wherein the metal light shield is connected to the TSHS.

18. The CMOS image sensor of claim 15, wherein the heat control structure comprises a through silicon heat barrier (TSHB) structure formed of a thermally insulating material.

19. The CMOS image sensor of claim 18, further comprising:
   a shallow trench isolation (STI) disposed within the device layer along a boundary between the pixel array region and the peripheral circuits region,
   wherein the STI extends into the device layer from the frontside of the device layer,
   wherein the TSHB structure extends through the device wafer substrate into the device layer and contacts the STI.

* * * * *